(12) United States Patent
Ge

(10) Patent No.: US 12,527,183 B2
(45) Date of Patent: Jan. 13, 2026

(54) DISPLAY PANEL WITH ANTI-STATIC GROOVES AND DISPLAY APPARATUS

(71) Applicant: Wuhan Tianma Microelectronics Co., Ltd., Wuhan (CN)

(72) Inventor: Shaoxiong Ge, Wuhan (CN)

(73) Assignee: WUHAN TIANMA MICROELECTRONICS CO., LTD., Wuhan (CN)

(*) Notice: Subject to any disclaimer, the term of this patent is extended or adjusted under 35 U.S.C. 154(b) by 397 days.

(21) Appl. No.: 18/143,621

(22) Filed: May 5, 2023

(65) Prior Publication Data

US 2024/0260346 A1   Aug. 1, 2024

(30) Foreign Application Priority Data

Feb. 1, 2023  (CN) .......................... 202310099243.4

(51) Int. Cl.
*H10K 59/131* (2023.01)
*H10K 71/70* (2023.01)
*H10K 77/10* (2023.01)

(52) U.S. Cl.
CPC ........... *H10K 59/131* (2023.02); *H10K 71/70* (2023.02); *H10K 77/111* (2023.02)

(58) Field of Classification Search
CPC .... H10K 59/131; H10K 71/70; H10K 77/111; Y02E 10/549
See application file for complete search history.

(56) References Cited

U.S. PATENT DOCUMENTS

2019/0244982 A1   8/2019  Lu et al.

FOREIGN PATENT DOCUMENTS

| CN | 108873512 A | 11/2018 | |
|---|---|---|---|
| CN | 112435988 A | 3/2021 | |
| CN | 113013359 A | 6/2021 | |
| CN | 113497200 A | 10/2021 | |
| CN | 113571568 A | 10/2021 | |
| CN | 113707652 A | 11/2021 | |
| CN | 113013359 B | * 9/2022 | ........... G06F 3/0412 |
| CN | 115497994 A | 12/2022 | |

OTHER PUBLICATIONS

Machine Tranlation of CN 113013359 (Year: 2022).*
The First Office Action for Chinese Application No. 202310099243.4, dated Jun. 6, 2025, 8 pages.

* cited by examiner

*Primary Examiner* — J.E. Schoenholtz
(74) *Attorney, Agent, or Firm* — East IP P.C.

(57) ABSTRACT

This application discloses a display panel which includes a display region, an aperture region and a first partition region which surrounds the aperture region, and the display region surrounds the first partition region; the display panel includes: a substrate including a first flexible layer; a buffer layer located at a side of the first flexible layer; a first conductive layer located at a side of the buffer layer away from the first flexible layer; and a first anti-static groove located in the first partition region and a second conductive layer located at the bottom of the first anti-static groove, the first anti-static groove at least partitions the buffer layer; or a second anti-static groove located in the first partition region and a third conductive layer located at the bottom of the second anti-static groove, and the second anti-static groove partitions at least a part of the first flexible layer.

13 Claims, 16 Drawing Sheets

_US 12,527,183 B2_

DISPLAY PANEL WITH ANTI-STATIC GROOVES AND DISPLAY APPARATUS

CROSS-REFERENCE TO RELATED APPLICATION

This application is based on and claims priority to Chinese Patent Application No. 202310099243.4, filed on Feb. 1, 2023 and titled "DISPLAY PANEL AND DISPLAY APPARATUS", which is incorporated herein by reference in its entirety.

TECHNICAL FIELD

The present application relates to the technical field of display panels, and in particular, to a display panel and a display apparatus.

BACKGROUND

An aperture is usually formed by cutting a display panel according to requirements, for example, providing an aperture for a camera. After the display panel is made, quality of the display panel is required to be checked by an electrostatic test. Since a cut surface of the aperture may have conductivity, static electricity may enter the display region under a condition that the electrostatic test is performed, so that light-emitting elements around the aperture may be lit. As a result, an anti-static capability of the display panel deteriorates after the aperture is formed.

SUMMARY

Embodiments of the present application provide a display panel and a display apparatus.

In a first aspect, a display panel is provided and includes a display region, an aperture region and a first partition region, wherein the first partition region surrounds the aperture region, and the display region surrounds the first partition region; along a thickness direction of the display panel, the display panel includes: a substrate including a first flexible layer; a buffer layer located at a side of the first flexible layer; a first conductive layer located at a side of the buffer layer away from the first flexible layer; and a first anti-static groove located in the first partition region and a second conductive layer located at the bottom of the first anti-static groove, wherein the first anti-static groove at least partitions the buffer layer, and the first conductive layer is electrically connected to the second conductive layer; or a second anti-static groove located in the first partition region and a third conductive layer located at the bottom of the second anti-static groove, wherein the second anti-static groove at least partially surrounds the aperture region, the second anti-static groove partitions at least a part of the first flexible layer along a direction from the first conductive layer to the substrate, and the third conductive layer and the first conductive layer are arranged to be insulated.

In a second aspect, the present application further provides a display apparatus including the display panel according to the embodiments of the first aspect of the present application.

BRIEF DESCRIPTION OF THE DRAWINGS

In order to illustrate technical solutions of embodiments of the present application more clearly, the drawings required for the embodiments of the present application will be briefly described below. Obviously, the drawings described below are only some embodiments of the present application. For a person skilled in the art, other drawings can also be obtained from these drawings without any inventive effort.

REFERENCE SIGNS

Figure 1:
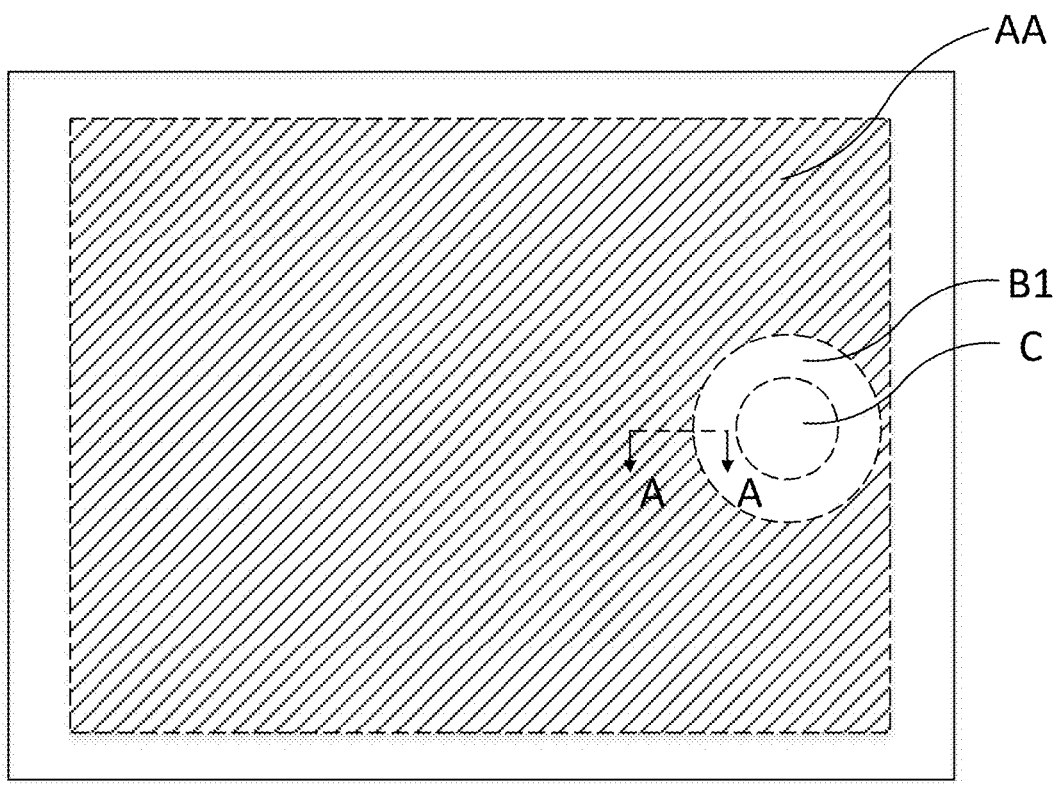
FIG. 1 is a schematic view of a display panel according to an embodiment of the present application.

10: Display panel; 110: Substrate; 111: First flexible layer; 112: Inorganic layer; 113: Second flexible layer; 120: Array layer; 130: Buffer layer; 140: Light-emitting functional layer; 141: Anode; 142: Organic light-emitting layer; 143: Cathode; 144, Hole transport layer; 145: Electron transport layer; 146: Pixel definition layer; 147: Pixel definition opening; 148: Light-emitting device; 150: First conductive layer; 160: Second conductive layer; 170: Third conductive layer; 180: Fourth conductive layer; 190: Fifth conductive layer; 210: First anti-static groove; 220: Second anti-static groove; 230: First partition groove;

AA: Display region; B1: First partition region; B2: Wall region; B3: Second partition region; C: Aperture region; D: Doped region.

DETAILED DESCRIPTION

Features and exemplary embodiments of various aspects of the present application will be described in detail below. Numerous specific details are set forth in the following detailed description to provide a thorough understanding of the present application. However, it will be apparent to a person skilled in the art that the present application may be practiced without some of these specific details. The following description of the embodiments is merely to provide a better understanding of the present application by illustrating examples of the present application.

It should be noted that the embodiments in the present application and the features of the embodiments may be combined with each other in the case of no conflict. The embodiments will be described in detail below with reference to the accompanying drawings.

Relational terms such as "first" and "second" are used only for distinguishing one entity or operation from another entity or operation, and do not necessarily require or imply any such actual relationship or order between these entities or operations. Moreover, the terms "comprising", "including", or any other variant thereof, are intended to encompass a non-exclusive inclusion, such that a process, a method, an article or a device including a series of elements not only includes these elements, but also includes other elements not explicitly listed, or includes elements inherent to the process, the method, the article or the device. Without further limitation, an element preceded by "including . . . " does not exclude presence of additional similar elements in a process, a method, an article or a device including the element.

It should be noted that when the structure of a component is described, a layer/region being located "above" or "over" another layer/region may mean that the layer/region is directly located above another layer/region, or other layers or regions are further included between the layer/region and another layer/region. Moreover, if the component is flipped, the layer/region will be located "under" or "below" another layer/region.

In addition, the term "and/or" used herein refers to only an association relationship for describing associated objects, and means that there may be three kinds of relationships. For example, "A and/or B" may represent three cases including: "A exists alone", "A and B exist simultaneously", and "B exists alone". In addition, the character "/" herein generally represents that there is an "or" relationship between the associated objects preceding and succeeding the character "/" respectively.

It should be understood that, in the embodiments of the present application, "B corresponding to A" represents that B is associated with A, and B may be determined according to A. However, it should further be understood that, determining B according to A does not mean that B is determined merely according to A, and B may also be determined according to A and/or other information.

The applicant has found that, under a condition that it is necessary to arrange an aperture so as to arrange a structure such as a camera on a display panel, the aperture is often made by cutting. However, when cutting, a sidewall of the aperture will be carbonized, forming a conductive structure. Under a condition that an electrostatic test is performed, static electricity is conducted via the carbonized sidewall of the aperture towards the interior of the display panel to a substrate layer. Under a condition that the display panel is a flexible display panel, a flexible substrate may have certain conductivity. The static electricity is conducted to a display region of the display panel via the flexible substrate, and under a condition that the static electricity is conducted to a position where a corresponding pixel circuit is located in the display region, the static electricity may cause thin film transistor (TFT) in the pixel circuit to be triggered erroneously, which causes a light-emitting device corresponding to the thin film transistor to emit light. That is, an anti-static capability of the display panel deteriorates after the aperture is formed through cutting.

In view of the above analysis, a display panel and a display apparatus has been proposed by the applicant. The display panel includes a display region, an aperture region and a first partition region, the display region surrounds the aperture region, the first partition region is located between the display region and the aperture region, and a first anti-static groove or a second anti-static groove is arranged in the first partition region. Under a condition that the first anti-static groove is arranged, the first anti-static groove partitions a buffer layer, a second conductive layer in the first anti-static groove is in contact with both a first conductive layer and a first flexible layer of the substrate so as to form a path for the static electricity, and the static electricity is guided out via the first flexible layer, the second conductive layer and the first conductive layer so as to block continuous conduction of the static electricity to the display region via the first flexible layer, which improves the anti-static capability of the display panel of the present application. Under a condition that the second anti-static groove is arranged, the second anti-static groove partitions the first flexible layer so as to directly block the conduction of the static electricity to the display region via the first flexible layer, which can also improve the anti-static capability of the display panel of the present application.

Figure 2:
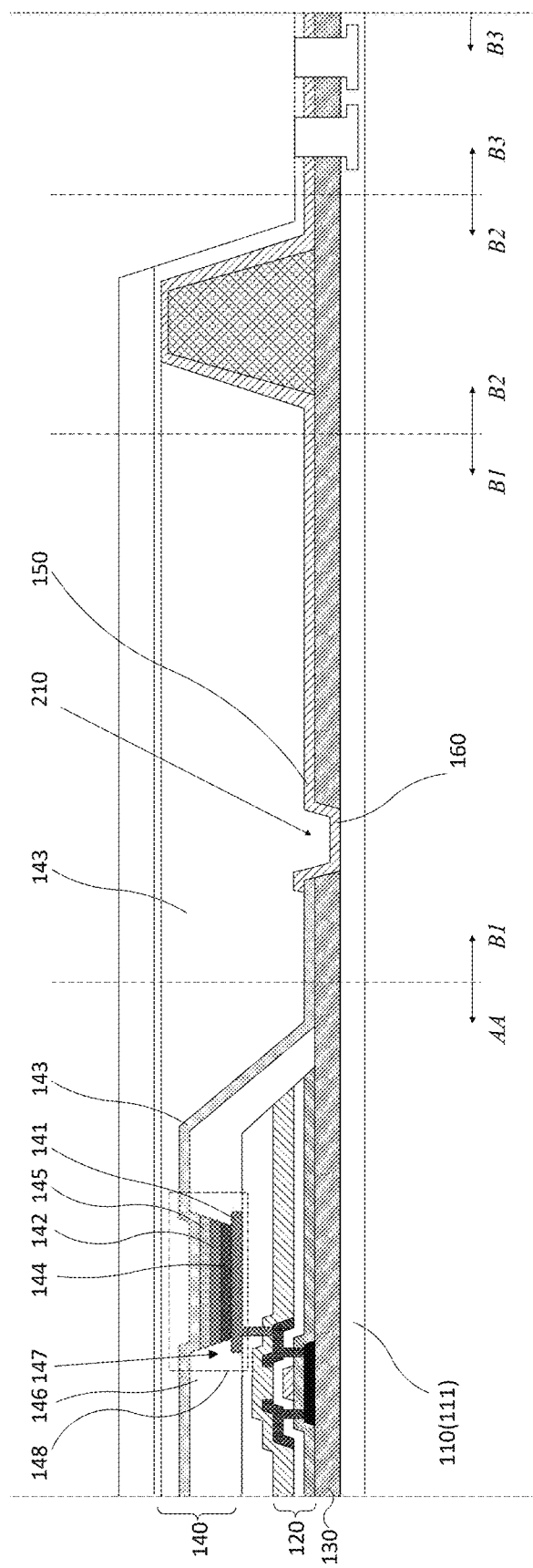
FIG. 2 is a sectional view of section A-A of a display panel according to an embodiment of the present application in FIG. 1.

FIG. 1 is a schematic view of a display panel according to an embodiment of the present application. FIG. 2 is a sectional view of section A-A of a display panel according to an embodiment of the present application in FIG. 1.

Specifically, with reference to FIG. 1 and FIG. 2, the embodiments of the present application provide a display panel 10 including a display region AA, an aperture region C and a first partition region B1, the first partition region B1 surrounds the aperture region C, and the display region AA surrounds the first partition region B1; along a thickness direction of the display panel 10, the display panel 10 includes: a substrate 110 including a first flexible layer 111; a buffer layer 130 located at a side of the first flexible layer 111; a first conductive layer 150 located at a side of the buffer layer 130 away from the first flexible layer 111; a first anti-static groove 210 located in the first partition region B1, wherein the first anti-static groove 210 at least partitions the buffer layer 130; and a second conductive layer 160 located at the bottom of the first anti-static groove 210, wherein the first conductive layer 150 is electrically connected to the second conductive layer 160.

With further reference to FIG. 1, the display panel 10 according to the embodiments of the present application includes the display region AA, the aperture region C and the first partition region B1. In the display panel 10 according to the embodiments of the present application, a region corresponding to the display region AA can display and emit light. An aperture is arranged in the aperture region C of the display panel 10 according to the embodiments of the present application. The display region AA may surround the aperture region C, that is, the aperture may be arranged in a middle part or on an edge of the display panel 10 according to the embodiments of the present application. The first partition region B1 is located between the display region AA and the aperture region C, and is configured for blocking moisture and static electricity from entering the display region AA via the aperture region. The aperture located in the aperture region C may extend through the display panel 10 according the embodiments of the present application.

With further reference to FIG. 2, the substrate 110 takes the form of a flexible substrate 110 including the first flexible layer 111 which may be transparent, translucent or opaque. The first flexible layer 111 may have certain conductivity. The buffer layer 130 is located at a side of the flexible substrate 110 and may include a stacked structure of a plurality of inorganic layers and organic layers, to block oxygen and moisture, prevent moisture or impurities from diffusing through the substrate, and provide a flat surface on an upper surface of the substrate. The specific structure is not described in detail in the present application. It should be noted that, a part of the buffer layer 130 and a part of the substrate 110 are located in the display region AA, and a part of the buffer layer 130 and a part of the substrate 110 are located in the first partition region B1.

With further reference to FIG. 2, the display panel 10 according to the embodiments of the present application may include an array layer 120, a light-emitting functional layer 140 and an encapsulation layer in the display region AA. The array layer 120 is located over the substrate 110. The light-emitting functional layer 140 is located at a side of the array layer 120 away from the substrate 110. The encapsulation layer is located at a side of the light-emitting functional layer 140 away from the array layer 120. The light-emitting functional layer 140 includes light-emitting devices 148. The light-emitting devices 148 may be an organic light-emitting diode (OLED) including an anode 141, an organic light-emitting layer 142, a cathode 143 and a pixel definition layer 146 located above the anode 141. The anode 141, the organic light-emitting layer 142 and the cathode 143 are sequentially arranged along a direction away from the substrate 110. The anode 141 includes anode 141 patterns corresponding to pixel units on a one-to-one basis, and the anode 141 patterns are connected to a source or a drain of a thin film transistor by a via on a planarization layer. The pixel definition layer 146 is located at a side of the anode 141 away from the array layer 120. The pixel definition layer 146 may be formed of an organic material such as polyimide (PI), polyamide, benzocyclobutene (BCB), acryl resin or phenol resin, or be formed of an inorganic material such as $SiN_x$.

With further reference to FIG. 2, the pixel definition layer 146 includes a plurality of pixel definition openings 147 exposing the anode 141. The pixel definition layer 146 covers edges of the anode 141 patterns. The organic light-emitting layer 142 is at least partially filled in the pixel definition opening 147 and is in contact with the anode 141. A minimum light-emitting device 148 is formed by the organic light-emitting layer 142 in the pixel definition opening 147, each of the light-emitting devices 148 can emit different colors of light according to different organic light-emitting layers 142, each of the light-emitting devices 148 and a pixel circuit together constitute a sub-pixel, a plurality of sub-pixels form a pixel unit, and an image is displayed by a plurality of pixel units.

With further reference to FIG. 2, the organic light-emitting layer 142 may be formed in the pixel definition opening 147 of the pixel definition layer 146 by using methods such as ink-jet printing or nozzle printing, or evaporation and the like. The cathode 143 may be formed on the organic light-emitting layer 142 by using a method of evaporation. Optionally, the cathode 143 is entirely covered by the organic light-emitting layer 142 and the pixel definition layer 146.

With further reference to FIG. 2, the light-emitting functional layer 140 further includes a hole transport layer 144 and an electron transport layer 145, and the hole transport layer 144 is located on a surface at a side of the anode 141 away from the substrate 110, the organic light-emitting layer 142 is located on a surface at a side of the hole transport layer 144 away from the anode 141, and the electron transport layer 145 is located on a surface at a side of the organic light-emitting layer 142 away from the hole transport layer 144. The hole transport layer 144 is arranged between the anode 141 and the organic light-emitting layer 142 for enhancing an ability of the anode 141 of hole injection and transport to the organic light-emitting layer 142, and the electron transport layer 145 is arranged between the organic light-emitting layer 142 and the cathode 143 for enhancing an ability of the cathode 143 of electron injection and transport to the organic light-emitting layer 142. Therefore, more holes and electrons may be injected into the organic light-emitting layer 142 so as to improve recombination efficiency and achieve an effect of improving light-emitting efficiency of the organic light-emitting layer 142.

With further reference to FIG. 2, the array layer 120 includes a plurality of thin film transistors (TFT) and the thin film transistors form pixel circuits for controlling the light-emitting devices 148. In the embodiments of the present application, an example is given in which a top-gate-type thin film transistor is used to illustrate the structure. The array layer 120 includes: an active layer for forming the thin film transistor, wherein the active layer includes a source region and a drain region formed by doping N-type impurity ions or P-type impurity ions; a channel region located between the source region and the drain region; a gate insulating layer located on the active layer; and a gate of the thin film transistor located on the gate insulating layer; an interlayer insulating layer located on the gate. The interlayer insulating layer may be formed by an insulating inorganic layer of silicon oxide or silicon nitride, or the like, and optionally, the interlayer insulating layer may be formed by an insulating organic layer. The source and the drain of the thin film transistor are located on the interlayer insulating layer. The source and the drain are electrically connected (or bonded) to the source region and the drain region, respectively, by contact holes formed by selectively removing the gate insulating layer and the interlayer insulating layer.

With further reference to FIG. 2, the display panel 10 according to the embodiments of the present application may further include an encapsulation layer located at a side of the first conductive layer 150 away from the substrate 110, and the encapsulation layer covers the first anti-static groove 210. The encapsulation layer may be a thin film encapsulation layer completely covering the whole display region AA and extending from the display region AA to the first partition region B1. The encapsulation layer encapsulates the light-emitting functional layer 140 in the display region A and encapsulates the first anti-static groove 210 in the first partition region B1.

With further reference to FIG. 2, the display panel 10 according to the embodiments of the present application further includes a wall region B2 and a second partition region B3, the wall region B2 is located between the first partition region B1 and the aperture region C, a wall structure is arranged in the wall region B2, and the wall structure is arranged along the thickness direction of the display panel 10 and is located at a side of the buffer layer 130 away from the substrate 110. Under a condition that the encapsulation layer is prepared, the wall structure blocks a material of the encapsulation layer from flowing from the display region AA and the first partition region B1 towards the aperture region C. The second partition region B3 is located between the wall region B2 and the aperture region C, and a plurality of partition grooves are arranged in the second partition region B3 along a direction from the wall region B2 to the aperture region C for preventing moisture from entering the display region AA.

With further reference to FIG. 2, in the embodiments of the present application, the first conductive layer 150 is located at a side of the buffer layer 130 away from the first flexible layer 111 and may be prepared by using the method of evaporation. A part of the first conductive layer 150 may be located in the display region AA, and a part of the first conductive layer 150 may further be located in the first partition region B1.

With further reference to FIG. 2, in the first partition region B1, the first anti-static groove 210 is arranged in the display panel 10 according to the embodiments of the present application for blocking the static electricity from entering the display region AA via the first flexible layer 111. The first anti-static groove 210 extends along the thickness direction of the display panel 10 and partitions at least the buffer region, so that the first flexible layer 111 is exposed at the bottom of the first anti-static groove 210. The second conductive layer 160 is arranged at the bottom of the first anti-static groove 210 and is electrically connected to the first conductive layer 150. Considering that the first flexible layer 111 also has certain conductivity, the first flexible layer 111, the second conductive layer 160 and the first conductive layer 150 form a current path. After the static electricity is conducted to the first anti-static groove 210 via the first flexible layer 111, since the conductivity of the first conductive layer 150 and the second conductive layer 160 is significantly superior to the conductivity of the first flexible layer 111, the static electricity is preferentially led out via the second conductive layer 160 and the first conductive layer 150 so as to make it difficult to continue to conduct the static electricity to the display region AA along the first flexible layer 111, which improves the anti-static capability of the display panel 10 according to the embodiments of the present application.

Further, with further reference to FIG. 2, the first anti-static groove 210 partitions the first conductive layer 150 and the buffer layer 130, and the second conductive layer 160 is formed on a surface of the first flexible layer 111.

In addition to partitioning the buffer layer 130, the first anti-static groove 210 may also partition the first conductive layer 150, so that the first conductive layer 150 extends to an edge of the first anti-static groove 210. A surface at a side of the first flexible layer 111 towards the buffer layer 130 is exposed at the bottom of the first anti-static groove 210, and the second conductive layer 160 is located on the surface of the first flexible layer 111 and is located at the bottom of the first anti-static groove 210. The first conductive layer 150 may be connected to the second conductive layer 160 by using a method of via connection; and the first conductive layer 150 may also be connected to the second conductive layer 160 by using a method of overlapping, and the first conductive layer 150 may also be connected to the second conductive layer 160 by fabricating the first conductive layer 150 and the second conductive layer 160 on the same layer, so as to ensure that an effect of electrical connection between the first conductive layer 150 and the second conductive layer 160 is good. The second conductive layer 160 covers the first flexible layer 111 exposed at the bottom of the first partition groove 230, and the second conductive layer 160 is connected to the first flexible layer 111 by using the method of overlapping so as to further ensure that an effect of connection between the second conductive layer 160 and the first flexible layer 111 is good, so that the static electricity can be conducted out via the second conductive layer 160 and the first conductive layer 150 so as to reduce the possibility that the static electricity enters the display region AA via the first flexible layer 111, thereby improving the anti-static capability of the display panel 10 according the embodiments of the present application.

Figure 3:
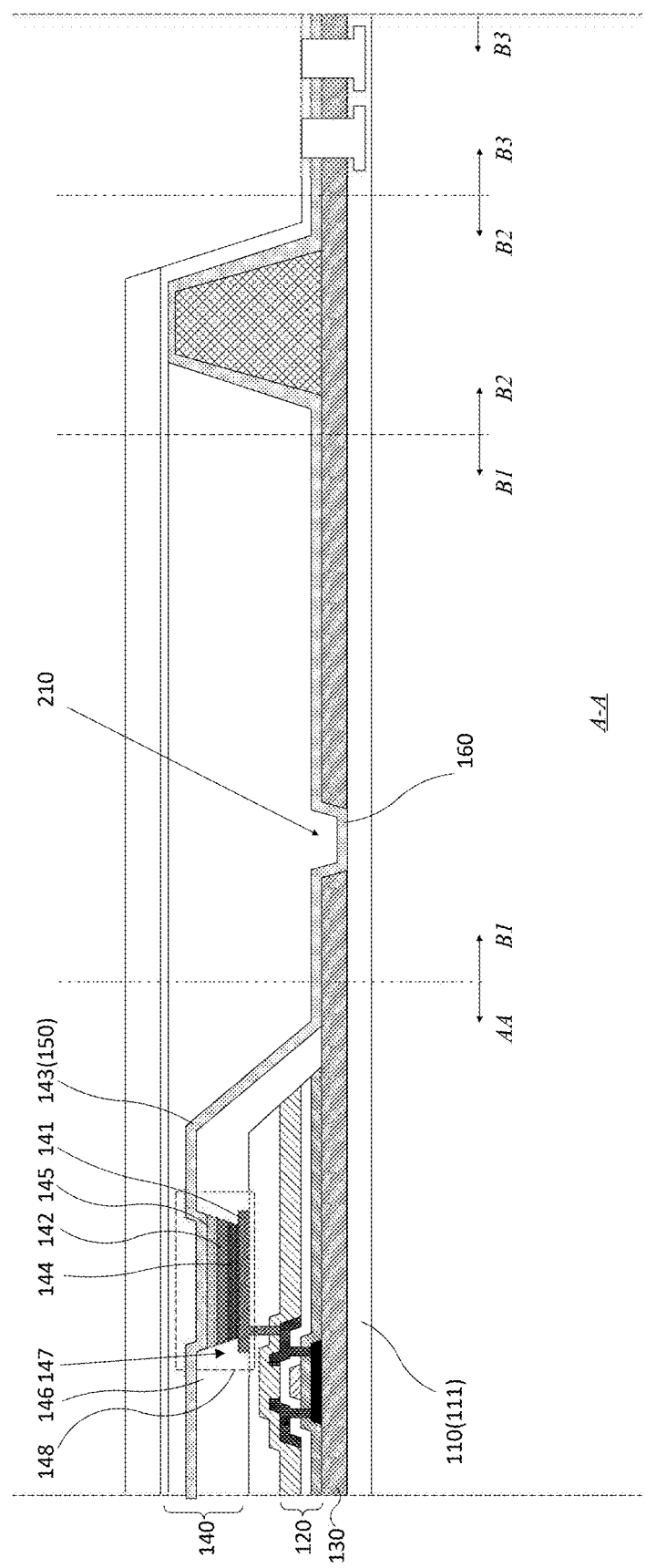
FIG. 3 is another sectional view of section A-A of a display panel according to an embodiment of the present application in FIG. 1.

FIG. 3 is a sectional view of section A-A of a display panel according to an embodiment of the present application in FIG. 1.

Further, with further reference to FIG. 3, the first conductive layer 150 is reused as the second conductive layer 160, and the first conductive layer 150 is an evaporation layer of the cathode 143 and is continuously distributed on a sidewall of the first anti-static groove 210.

A part of the first conductive layer 150 located in the display region AA may be used as the cathode 143 of the light-emitting functional layer 140, that is, the first conductive layer 150 is the evaporation layer of the cathode 143. The first conductive layer 150 is reused as the second conductive layer 160, and during fabrication, the first conductive layer 150 and the second conductive layer 160 may be made on the same layer by using the method of evaporation. Electrical connection between the first conductive layer 150 and the second conductive layer 160 is simplified. In actual operation of the display panel 10 according to the embodiments of the present application, the first conductive layer 150 may be at a low-level state. Since the first flexible layer 111, the second conductive layer 160 and the first conductive layer 150 form a conduction path in the first partition region B1, under a condition that the static electricity enters the first flexible layer 111 from the aperture region C, a low-level signal of the first conductive layer 150 covers a voltage of the static electricity to reduce effects of the static electricity on the display region AA.

Further, with further reference to FIG. 3, an opening width of the first anti-static groove 210 gradually decreases along a direction from the first conductive layer 150 to the substrate 110; a bottom width of the first anti-static groove 210 is greater than zero such that the first conductive layer 150 covers, at the bottom of the first anti-static groove 210, at least a part of the first flexible layer 111.

Along the direction from the first conductive layer 150 to the substrate 110, the first anti-static groove 210 has a wide top and a narrow bottom, and the first flexible layer 111 is exposed at the bottom of the first anti-static groove 210, so that the first anti-static groove 210 is formed to be an inverted trapezoidal geosyncline structure. When making the second conductive layer 160, the second conductive layer 160 may cover the first flexible layer 111 exposed at the bottom of the first anti-static groove 210, and may further cover the sidewall of the first anti-static groove 210 so as to extend to the edge of the first anti-static groove 210, so that the first conductive layer 150 and the second conductive layer 160 may be made on the same layer, and the first conductive layer 150 is reused as the second conductive layer 160.

Figure 4:
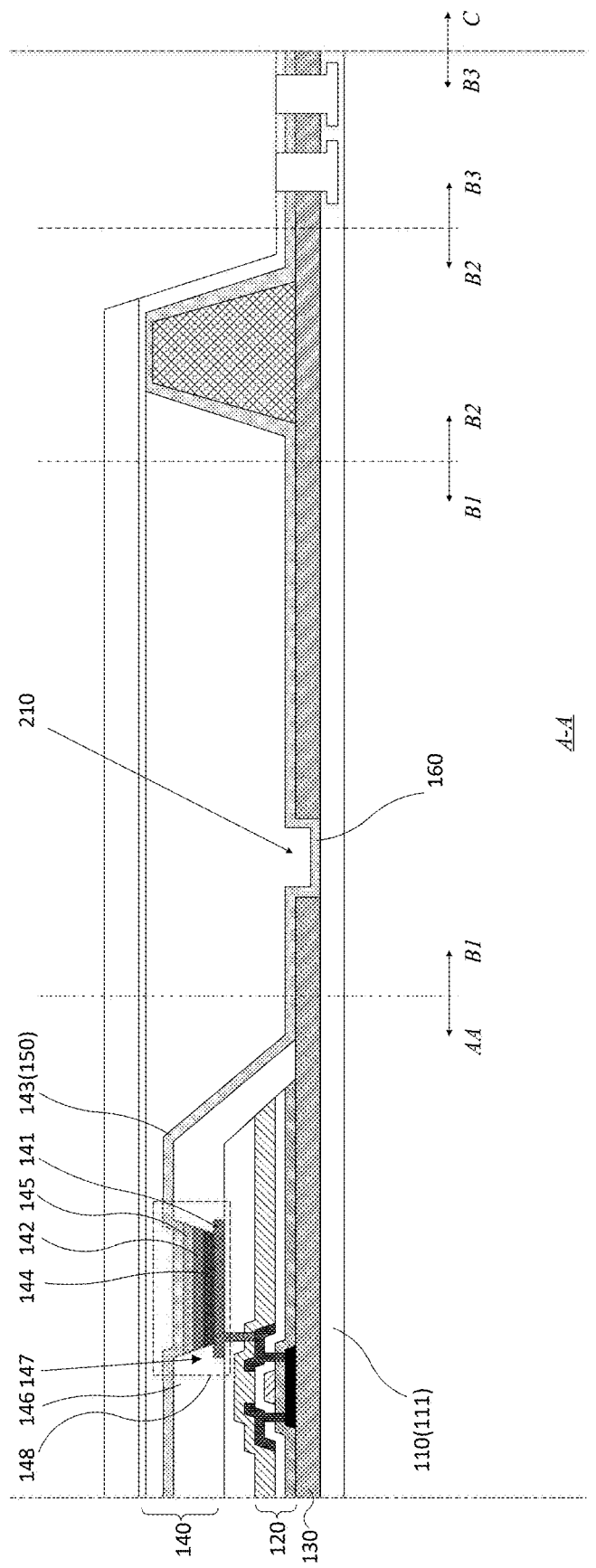
FIG. 4 is another sectional view of section A-A of a display panel according to an embodiment of the present application in FIG. 1.

FIG. 4 is another sectional view of section A-A of a display panel according to an embodiment of the present application in FIG. 1.

Optionally, with reference to FIG. 4, an opening width of the first anti-static groove 210 may be kept constant along the direction from the first conductive layer 150 to the substrate 110, so that the first anti-static groove 210 is formed to be a straight groove, and similarly, the second conductive layer 160 may further cover the sidewall of the first anti-static groove 210 so as to extend to the edge of the first anti-static groove 210, so that the first conductive layer 150 and the second conductive layer 160 may be made on the same layer, and the first conductive layer 150 is reused as the second conductive layer 160.

Figure 5:
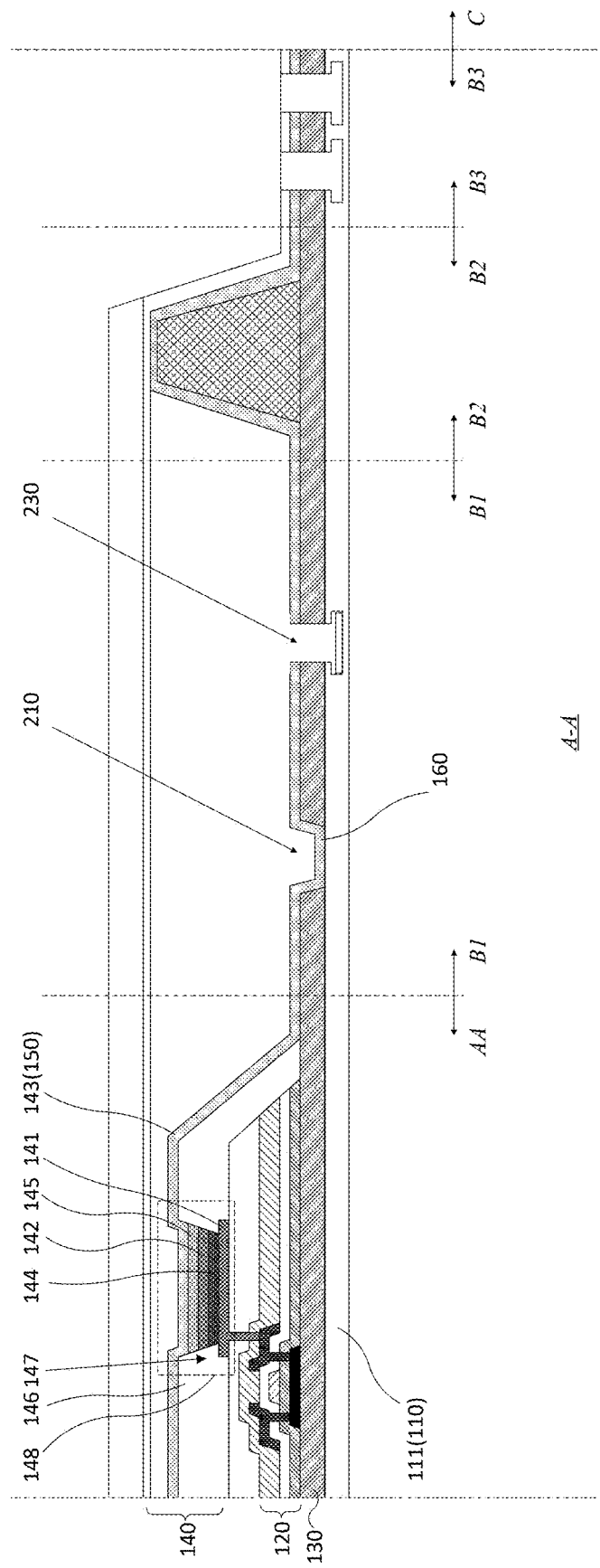
FIG. 5 is another sectional view of section A-A of a display panel according to an embodiment of the present application in FIG. 1.

FIG. 5 is another sectional view of section A-A of a display panel according to an embodiment of the present application in FIG. 1.

Further, with further reference FIG. 5, the display panel 10 according to the embodiments of the present application further includes the first partition groove 230 arranged around the aperture region C, and along a direction from the aperture region C to the display region AA, the first partition groove 230 is located between the first anti-static groove 210 and the aperture region C, and the first partition groove 230 partitions the first conductive layer 150, the buffer layer 130 and at least a part of the first flexible layer 111.

In addition to blocking moisture from entering the display region AA from the aperture region C, the first partition groove 230 further partitions the first conductive layer 150, the buffer layer 130, and at least a part of the first flexible layer 111 so as to block the static electricity from entering the display region AA from the aperture region C through the first conductive layer 150 or the first flexible layer 111. In addition, the first partition groove 230 may further block an electric signal of the display region AA from entering the aperture region C via the first conductive layer 150. The first partition groove 230 and the first anti-static groove 210 are used together to greatly reduce the possibility that the static electricity enters the display region AA from the aperture region C, so as to ensure that the display panel has a good display effect.

Figure 6:
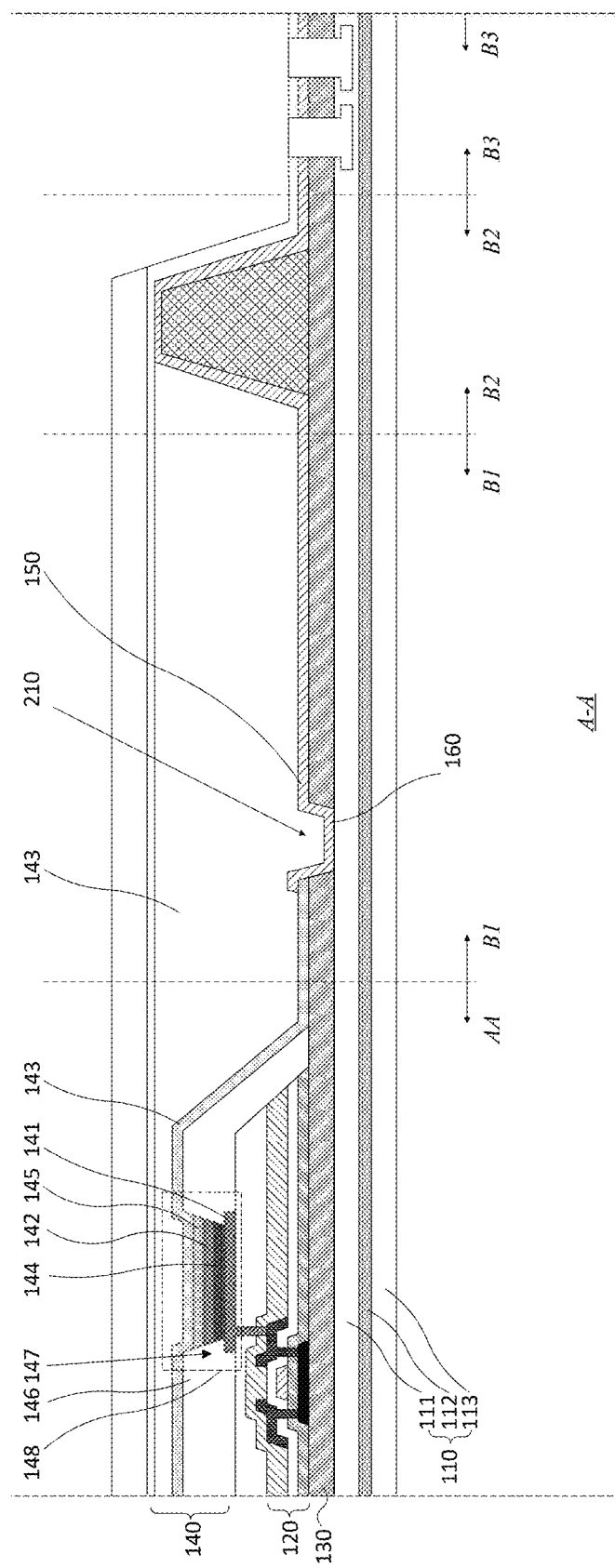
FIG. 6 is another sectional view of section A-A of a display panel according to an embodiment of the present application in FIG. 1.

FIG. 6 is another sectional view of section A-A of a display panel according to an embodiment of the present application in FIG. 1.

Further, with reference to FIG. 6, the substrate 110 further includes: an inorganic layer 112 located at a side of the first flexible layer 111 away from the buffer layer 130; a second flexible layer 113 located at a side of the inorganic layer 112 away from the first flexible layer 111.

The first flexible layer 111, the inorganic layer 112, and the second flexible layer 113 are sequentially stacked along a thickness direction of the substrate 110, so that the substrate 110 forms a multilayer structure. The first flexible layer 111 and the second flexible layer 113 can ensure that the substrate 110 has good flexibility, and the inorganic layer 112 can ensure that the substrate 110 has a good moisture-blocking ability. In an example, a material of the first flexible layer 111 and a material of the second flexible layer 113 may both be a relatively thin polymer, such as polyimide, and a material of the inorganic layer 112 may be amorphous silicon (A-Si). The first flexible layer 111, the inorganic layer 112 and the second flexible layer 113 all have certain conductivity, and the conductivity of the inorganic layer 112 is superior to the conductivity of the first flexible layer 111 and the second flexible layer 113.

Since the first anti-static groove 210 partitions the buffer layer 130, the second conductive layer 160 located at the bottom of the first anti-static groove 210 is in contact with the first flexible layer 111. Considering that the second conductive layer 160 is electrically connected to the first conductive layer 150, the first flexible layer 111, the second conductive layer 160 and the first conductive layer 150 can form a current conduction path. Under a condition that the static electricity is conducted to the display region AA via the first flexible layer 111, the inorganic layer 112 and the second flexible layer 113, the static electricity is preferentially conducted to a current conduction path with relatively high conductivity. Since the first conductive layer 150 and the second conductive layer 160 are often made of a metal material with relatively high conductivity, under a condition that the static electricity is conducted to the first anti-static groove 210, the static electricity will be conducted to the conduction path formed by the first flexible layer 111, the second conductive layer 160 and the first conductive layer 150 so as to reduce a possibility of the continuous conduction of the static electricity to the display region AA via the first flexible layer 111, the inorganic layer 112 and the second flexible layer 113, which reduces effects of the static electricity on the display region and improves display effects of the display panel according to the embodiments of the present application.

Figure 7:
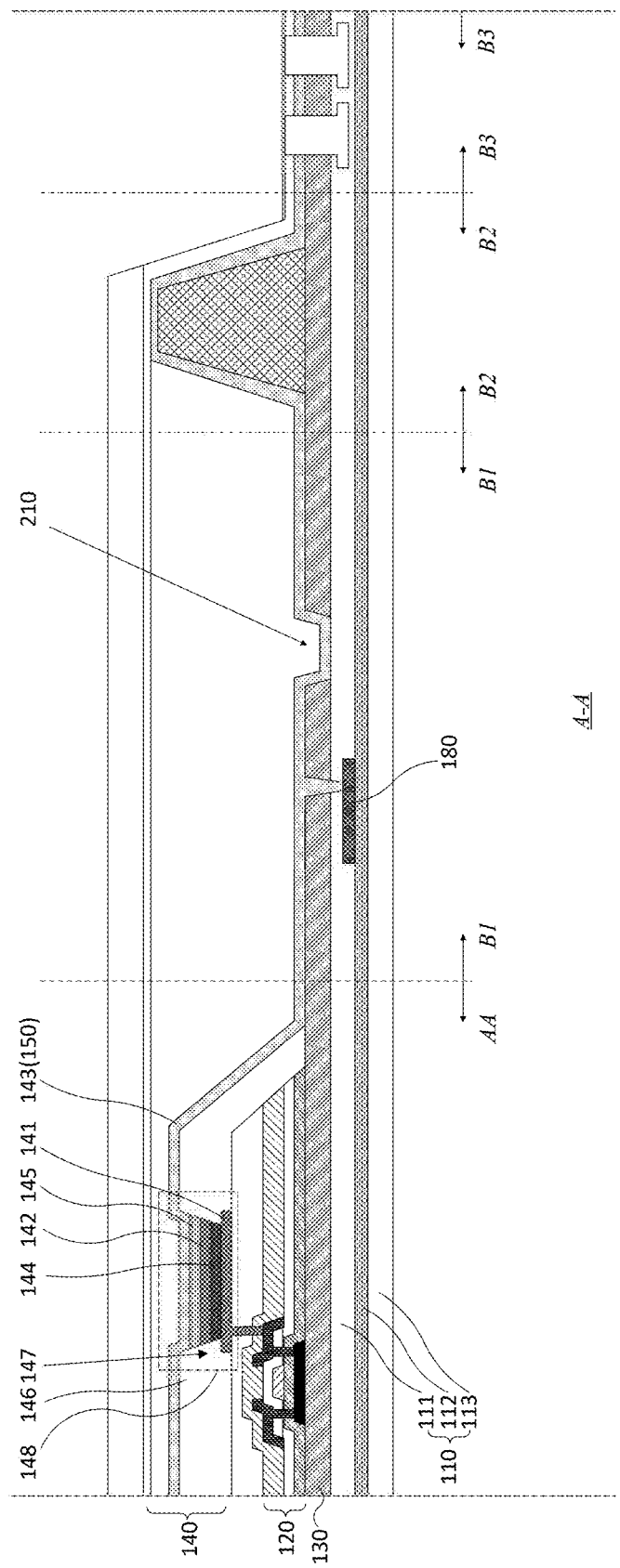
FIG. 7 is another sectional view of section A-A of a display panel according to an embodiment of the present application in FIG. 1.

FIG. 7 is another sectional view of section A-A of a display panel according to an embodiment of the present application in FIG. 1.

Further, with reference to FIG. 7, the display panel 10 according to the embodiments of the present application further includes a fourth conductive layer 180, along the direction from the first conductive layer 150 to the substrate 110, the fourth conductive layer 180 is located between the inorganic layer 112 and the buffer layer 130, and along the direction from the aperture region C to the display region AA, the fourth conductive layer 180 is located between the first anti-static groove 210 and the display region AA, and the fourth conductive layer 180 is electrically connected to the first conductive layer 150.

The fourth conductive layer 180 is located between the inorganic layer 112 and the buffer layer 130, that is, the fourth conductive layer 180 is in contact with the inorganic layer 112 to form a charge path, and the fourth conductive layer 180 is electrically connected to the first conductive layer 150, so that the inorganic layer 112, the fourth conductive layer 180 and the first conductive layer 150 form a charge path. After a small amount of static electricity has been conducted through the first anti-static groove 210 via the second flexible layer 113, the static electricity will be conducted to the first conductive layer 150 via the inorganic layer 112 and the fourth conductive layer 180, thereby blocking the static electricity from being conducted to the display region AA along the substrate 110, which further improves the anti-static capability of the display panel 10 according to the embodiments of the present application. Under a condition that the first conductive layer 150 is reused as the cathode 143 of the light-emitting functional layer 140, the low-level signal of the first conductive layer 150 covers the voltage of the static electricity to reduce the effects of the static electricity on the display region AA. In an example, the fourth conductive layer 180 may be located between the inorganic layer 112 and the first flexible layer 111. Under this condition, the fourth conductive layer 180 is in contact with the inorganic layer 112, so that the inorganic layer 112, the fourth conductive layer 180 and the first conductive layer 150 form a current conduction path, and the static electricity may be guided to the first conductive layer 150, thereby achieving the purpose of blocking the conduction of the static electricity to the display region via the first flexible layer 111 and the inorganic layer 112.

Figure 8:
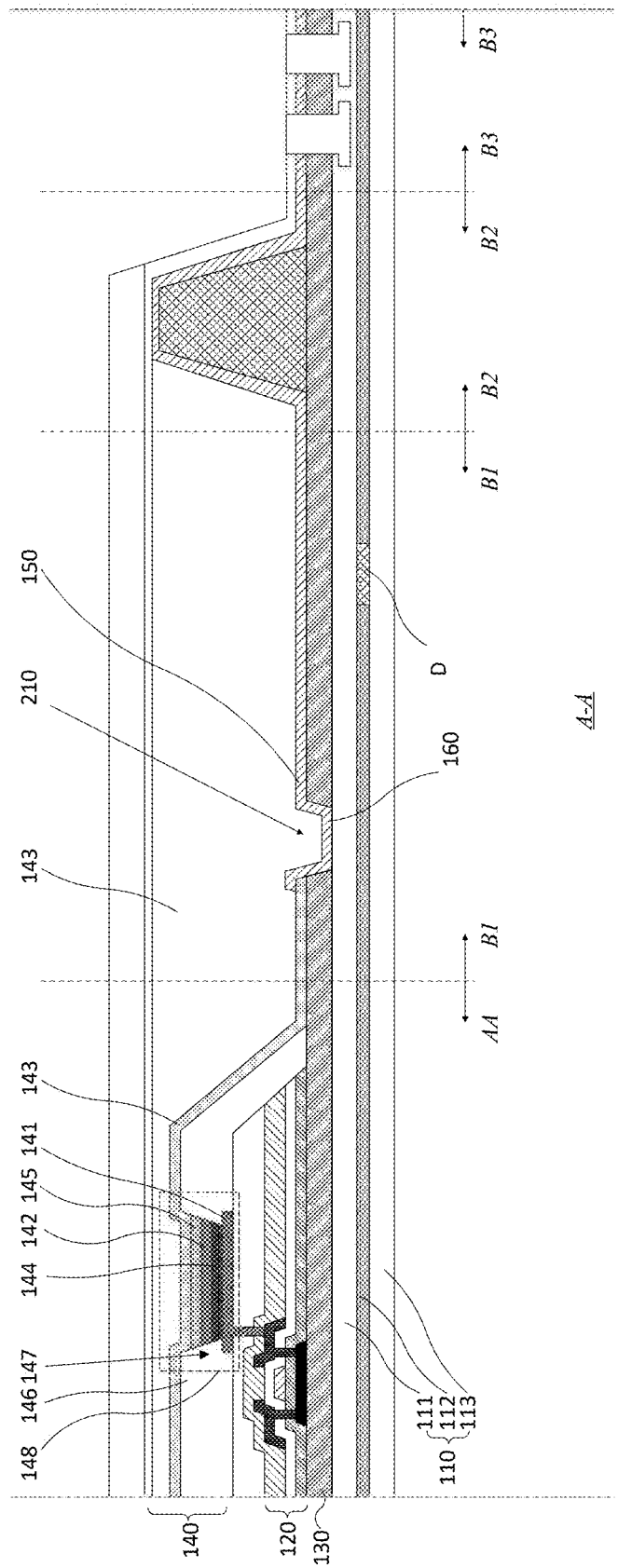
FIG. 8 is another sectional view of section A-A of a display panel according to an embodiment of the present application in FIG. 1.

FIG. 8 is another sectional view of section A-A of a display panel according to an embodiment of the present application in FIG. 1.

Further, with reference to FIG. 8, the inorganic layer 112 includes a doped region D located in the first partition region B1, and the doped region D has a hole structure.

The doped region D is arranged in the inorganic layer 112 so that the inorganic layer 112 forms a structure of a conventional inorganic layer-doped inorganic layer-conventional inorganic layer along a direction from the display region AA to the aperture region C. Since an inorganic material such as amorphous silicon is used by the inorganic layer 112, after the doped region D is doped, the inorganic layer 112 forms the hole structure so that a semiconductor structure is formed in the doped region D of the doped inorganic layer 112. Since the conductivity of the inorganic layer 112 is superior to the conductivity of the second flexible layer 113, the inorganic layer 112 is used as a primary conduction path for the static electricity under a condition that the first flexible layer 111 is partitioned. Under a condition that the static electricity is conducted to the display region AA via the inorganic layer 112, the semiconductor structure formed in the doped inorganic layer 112 will absorb and store the static electricity so as to block the further conduction of the static electricity to the display region AA, which improves the anti-static capability of the display panel 10 according to the embodiments of the present application. Under a condition that the display panel according to the embodiments of the present application is manufactured, after the inorganic layer 112 is prepared, a material may be directly doped at a position of the inorganic layer 112 corresponding to the doped region D, so that the hole structure is formed in the doped region D.

The doped region D may be located between the first anti-static groove 210 and the aperture region C. Under a condition that charge amount of the static electricity is excessive, absorption of the static electricity by the semiconductor structure corresponding to the doped region D may reach a saturation state, and the excessive static electricity may still be conducted to the display region AA via the first flexible layer 111, the inorganic layer 112 and the second flexible layer 113. Under this condition, since the first anti-static groove 210 is located between the doped region D and the display region AA, the excessive static electricity is conducted to the conduction path formed by the first flexible layer 111, the second conductive layer 160 and the first conductive layer 150, which may reduce the effects of the static electricity on the display region and improve the display effects of the display panel according to the embodiments of the present application.

Figure 9:
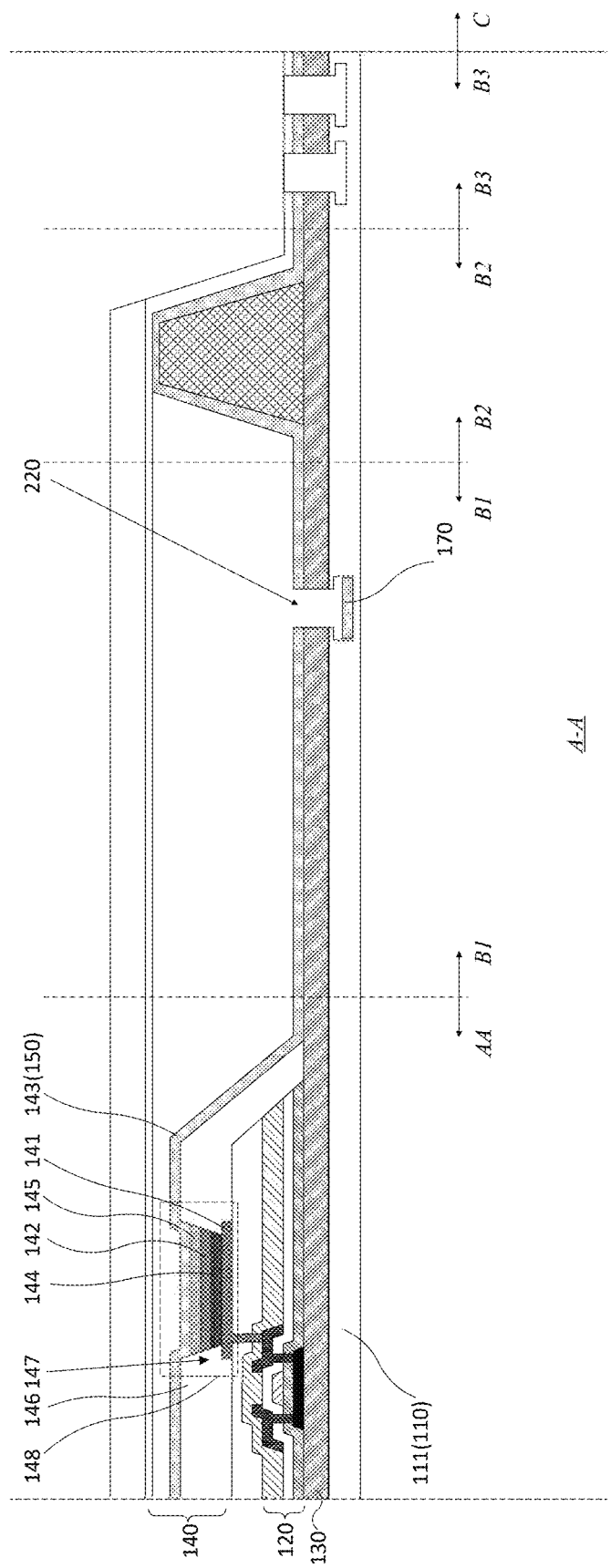
FIG. 9 is another sectional view of section A-A of a display panel according to an embodiment of the present application in FIG. 1.

FIG. 9 is another sectional view of section A-A of a display panel according to an embodiment of the present application in FIG. 1.

With reference to FIG. 9, in another embodiment of the present application, the second anti-static groove 220 is arranged in the first partition region B1, and a difference from the previous embodiments of the present application lies in a difference between the first anti-static groove 210 and the second anti-static groove 220 while other structures are the same.

Specifically, with reference to FIG. 9, the display panel 10 according to the embodiments of the present application further includes the second anti-static groove 220 and a third conductive layer 170. The second anti-static groove 220 is located in the first partition region B1 and at least partially surrounds the aperture region C; and the second anti-static groove 220 partitions at least a part of the first flexible layer 111 along the direction from the first conductive layer 150 to the substrate 110. The third conductive layer 170 is located at the bottom of the second anti-static groove 220, and the third conductive layer 170 and the first conductive layer 150 are arranged to be insulated.

In the first partition region B1, the second anti-static groove 220 is arranged in the display panel 10 according to the embodiments of the present application for blocking the static electricity from entering the display region AA via the first flexible layer 111. The second anti-static groove 220 extends along the thickness direction of the display panel 10, and the second anti-static groove 220 partitions the first flexible layer 111 to block the conduction of the static electricity to the display region AA via the first flexible layer 111, which improves the anti-static capability of the display panel 10 according to the embodiments of the present application. In addition, the third conductive layer 170 located at the bottom of the second anti-static groove 220 and the first conductive layer 150 are arranged to be insulated, so that electrical connection between the first conductive layer 150 and a side of the second anti-static groove 220 close to the aperture region is avoided to be formed. Therefore, a layer structure above the buffer layer 130 forms an insulation between the display region AA and the aperture region C due to the second partition groove.

Figure 10:
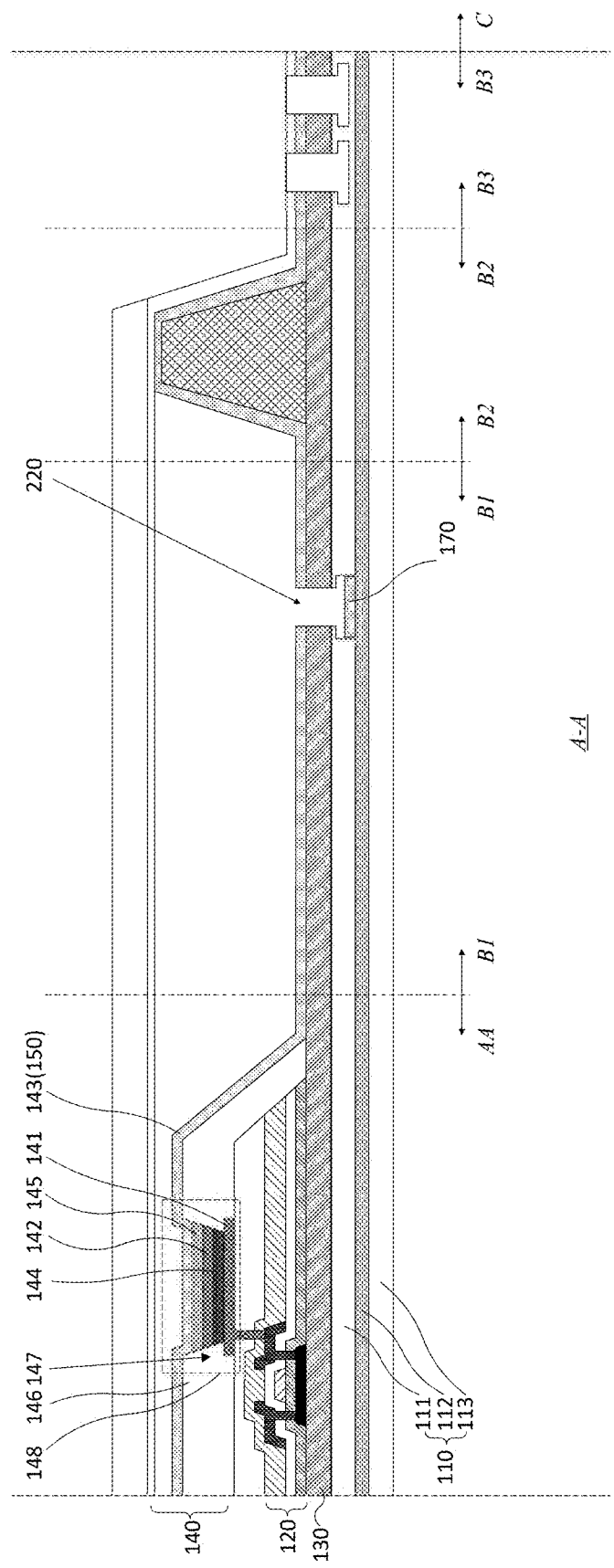
FIG. 10 is another sectional view of section A-A of a display panel according to an embodiment of the present application in FIG. 1.

FIG. 10 is another sectional view of section A-A of a display panel according to an embodiment of the present application in FIG. 1.

Further, with reference to FIG. 10, the substrate 110 further includes: an inorganic layer 112 located at a side of the first flexible layer 111 away from the buffer layer 130; a second flexible layer 113 located at a side of the inorganic layer 112 away from the first flexible layer 111.

The first flexible layer 111, the inorganic layer 112, and the second flexible layer 113 are sequentially stacked along the thickness direction of the substrate 110, so that the substrate 110 forms the multilayer structure. The first flexible layer 111 and the second flexible layer 113 can ensure that the substrate 110 has good flexibility, and the inorganic layer 112 can ensure that the substrate 110 has good moisture-blocking ability. In an example, the material of the first flexible layer 111 and the material of the second flexible layer 113 may both be relatively thin polymer, such as polyimide, and the material of the inorganic layer 112 may be amorphous silicon (A-Si). The first flexible layer 111, the inorganic layer 112 and the second flexible layer 113 all have certain conductivity, and the conductivity of the inorganic layer 112 is superior to the conductivity of the first flexible layer 111 and the second flexible layer 113.

Figure 11:
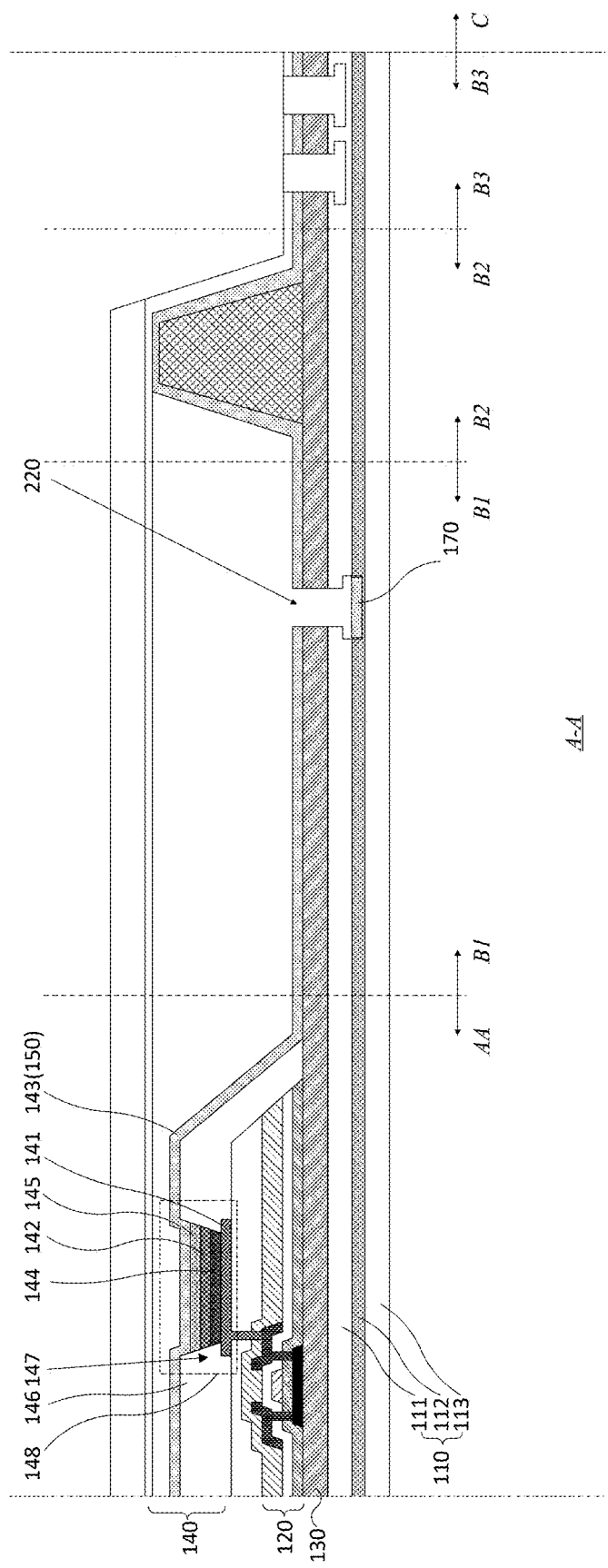
FIG. 11 is another sectional view of section A-A of a display panel according to an embodiment of the present application in FIG. 1.

FIG. 11 is another sectional view of section A-A of a display panel according to an embodiment of the present application in FIG. 1.

Further, with reference to FIG. 11, the second anti-static groove 220 partitions the first flexible layer 111 and at least a part of the inorganic layer 112 along the direction from the first conductive layer 150 to the substrate 110.

The second anti-static groove 220 partitions at least a part of the inorganic layer 112, and static electricity conductivity of the inorganic layer 112 at a recess of the second anti-static groove 220 is deteriorated. Based on a condition that the static electricity is difficult to be conducted by the first flexible layer 111, the second anti-static groove 220 partitions a part of the inorganic layer 112, which can further block the conduction of the static electricity to the display region AA to further improve the anti-static capability of the display panel 10 according to the embodiments of the present application. In addition, the second anti-static groove 220 may not partition the second flexible layer 113 to ensure structural strength of the substrate 110.

Further, with further reference to FIG. 11, along the direction from the aperture region C to the display region AA, an opening width of the second anti-static groove 220 is a first width, and along the direction from the first conductive layer 150 to the substrate 110, a first width of an end of the second anti-static groove 220 close to the first conductive layer 150 is less than a first width of the bottom of the second anti-static groove 220.

Along the direction from the aperture region C to the display region AA, the opening width of the second anti-static groove 220 is less than a bottom width of the second anti-static groove 220, so that the second anti-static groove 220 forms a groove structure with a narrow top and a wide bottom. In an example, the second anti-static groove 220 may be an inverted T-shaped groove structure with a narrow top and a wide bottom, or may be a trapezoidal groove structure with a narrow top and a wide bottom. Under a condition that the second anti-static groove 220 may be processed by using an under-cut process, the second anti-static groove 220 is an inverted T-shaped groove structure with a narrow top and a wide bottom, and an edge of the bottom of the second anti-static groove 220 is recessed relative to a sidewall. When making the third conductive layer 170, the first conductive layer 150 and the third conductive layer 170 may be made simultaneously by using the method of evaporation. Although the first conductive layer 150 and the third conductive layer 170 are made simultaneously by using the method of evaporation, the third conductive layer 170 located at the bottom of the second anti-static groove 220 is not in contact with the sidewall of the second anti-static groove 220 since the bottom of the second anti-static groove 220 is processed by the under-cut process, so that the first conductive layer 150 and the third conductive layer 170 form two metal layers that are not in contact with each other, which ensures that the second anti-static groove 220 partitions the layer structure (for example, the first conductive layer 150) located above the buffer layer 130 between the display region AA and the aperture region C. Under a condition that the first conductive layer 150 and the third conductive layer 170 are made simultaneously by using the method of evaporation, the first conductive layer 150 and the third conductive layer 170 may correspond to the cathode 143 or may be other metal functional layers made by using the method of evaporation. Therefore, in the embodiments of the present application, the second anti-static groove 220 may further be used as the partition groove in addition to improving the anti-static capability of the display panel 10.

Figure 12:
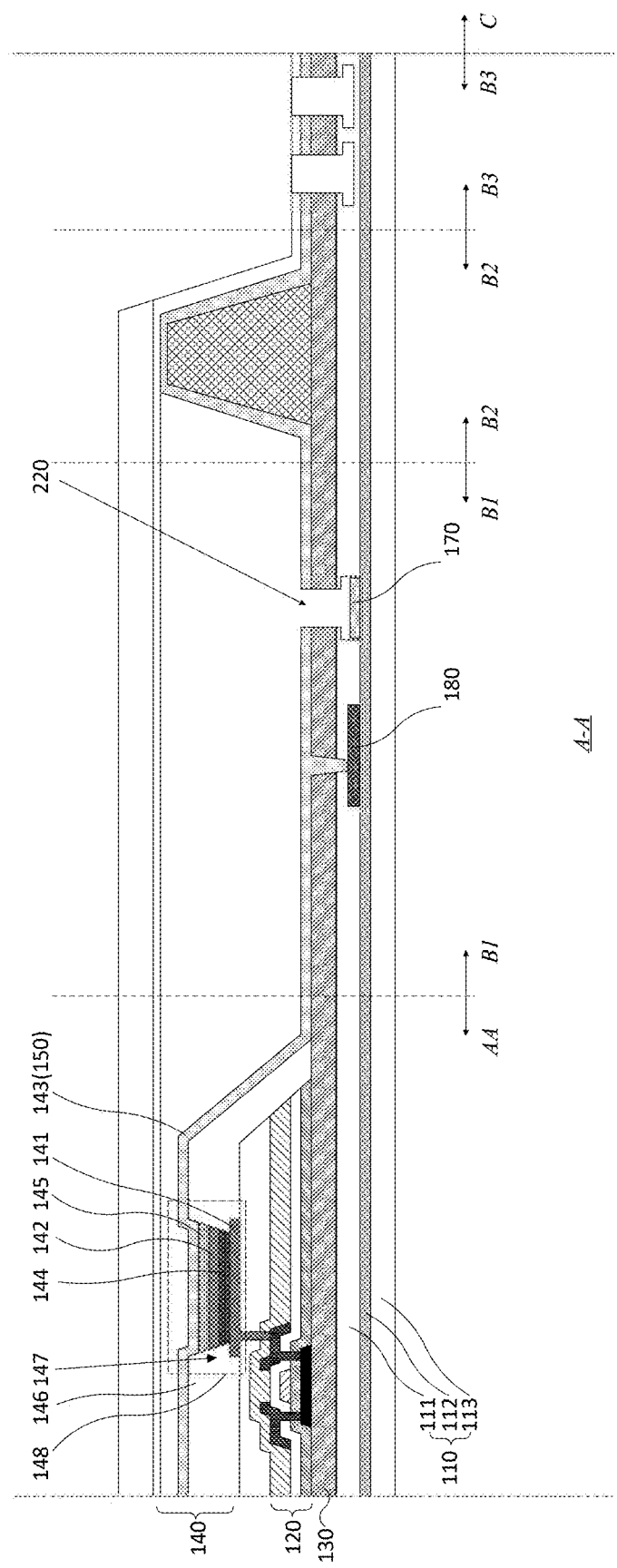
FIG. 12 is another sectional view of section A-A of a display panel according to an embodiment of the present application in FIG. 1.

FIG. 12 is another sectional view of section A-A of a display panel according to an embodiment of the present application in FIG. 1.

Further, with reference to FIG. 12, the display panel 10 according to the embodiments of the present application further includes the fourth conductive layer 180, along the direction from the first conductive layer 150 to the substrate 110, the fourth conductive layer 180 is located between the inorganic layer 112 and the buffer layer 130, and along the direction from the aperture region C to the display region AA, the fourth conductive layer 180 is located between the second anti-static groove 220 and the display region AA, and the fourth conductive layer 180 is electrically connected to the first conductive layer 150.

The fourth conductive layer 180 is located between the inorganic layer 112 and the buffer layer 130, that is, the fourth conductive layer 180 is in contact with the inorganic layer 112 to form the charge path, and the fourth conductive layer 180 is electrically connected to the first conductive layer 150, so that the inorganic layer 112, the fourth conductive layer 180 and the first conductive layer 150 form the charge path. After a small amount of static electricity has been conducted through the second anti-static groove 220 via the second flexible layer 113, the static electricity will be conducted to the first conductive layer 150 via the inorganic layer 112 and the fourth conductive layer 180 to block the conduction of the static electricity to the display region AA along the substrate 110, which further improves the anti-static capability of the display panel 10 according to the embodiments of the present application. Under a condition that the first conductive layer 150 is reused as the cathode 143 of the light-emitting functional layer 140, the low-level signal of the first conductive layer 150 covers the voltage of the static electricity to reduce the effects of the static electricity on the display region AA. In an example, the fourth conductive layer 180 may be located between the inorganic layer 112 and the first flexible layer 111. Under this condition, the fourth conductive layer 180 is in contact with the inorganic layer 112, so that the inorganic layer 112, the fourth conductive layer 180 and the first conductive layer 150 form a current conduction path, and the static electricity may be guided to the first conductive layer 150, thereby achieving the purpose of blocking the conduction of the static electricity to the display region via the first flexible layer 111 and the inorganic layer 112.

Figure 13:
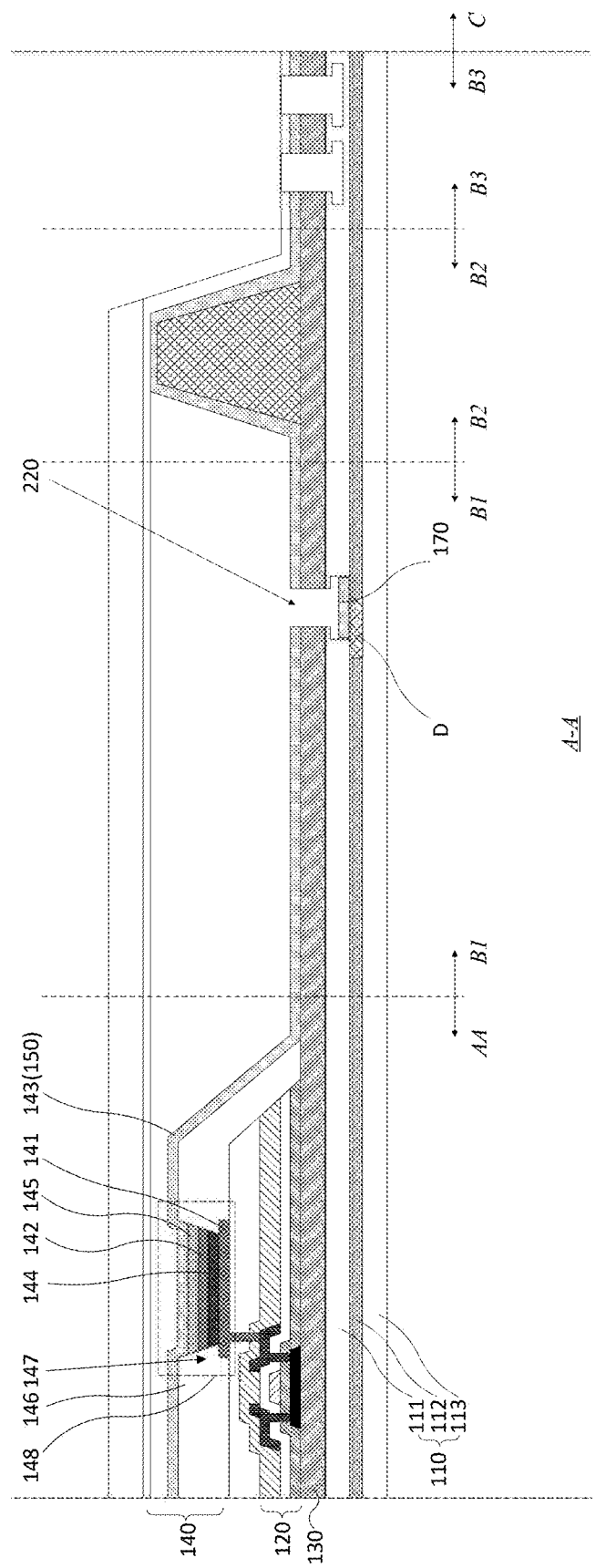
FIG. 13 is another sectional view of section A-A of a display panel according to an embodiment of the present application in FIG. 1.

FIG. 13 is another sectional view of section A-A of a display panel according to an embodiment of the present application in FIG. 1.

Further, with reference to FIG. 13, the inorganic layer 112 includes the doped region D located in the first partition region B1, and the doped region D has the hole structure.

The doped region D is arranged in the inorganic layer 112 so that the inorganic layer 112 forms the structure of the conventional inorganic layer-doped inorganic layer-conventional inorganic layer 112 along the direction from the display region AA to the aperture region C. Since the inorganic material such as amorphous silicon is used by the inorganic layer 112, after the doped region D is doped, the inorganic layer 112 forms the hole structure so that the doped inorganic layer 112 forms the semiconductor structure. Since the conductivity of the inorganic layer 112 is superior to the conductivity of the second flexible layer 113, the inorganic layer 112 is used as the primary conduction path for the static electricity under a condition that the first flexible layer 111 is partitioned. Under a condition that the static electricity is conducted to the display region AA via the inorganic layer 112, the semiconductor structure formed by the doped inorganic layer 112 will absorb and store the static electricity so as to block the further conduction of the static electricity to the display region AA, which improves the anti-static capability of the display panel 10 according to the embodiments of the present application.

Further, with further reference to FIG. 13, along the thickness direction of the display panel 10, an orthographic projection of the second anti-static groove 220 on the display panel 10 at least partially overlaps an orthographic projection of the doped region D on the display panel 10.

Along the thickness direction of the display panel 10, the orthographic projection of the second anti-static groove 220 on the display panel 10 at least partially overlaps the orthographic projection of the doped region D on the display panel 10 so that the doped region D of the inorganic layer 112 is located below the second anti-static groove 220. Considering that the static electricity has been conducted through the second anti-static groove 220 via the inorganic layer 112, the doped region D of the inorganic layer 112 is located below the second anti-static groove 220, so that the static electricity conducted via the inorganic layer 112 can be conducted to the doped region D of the inorganic layer 112, and therefore the static electricity will be absorbed by the doped region D. Therefore, the doped region D of the inorganic layer 112 is arranged below the second anti-static groove 220 to further improve the anti-static capability of the display panel 10 according to the embodiments of the present application FIG. 14 is another sectional view of section A-A of a display panel according to an embodiment of the present application in FIG. 1.

Figure 14:
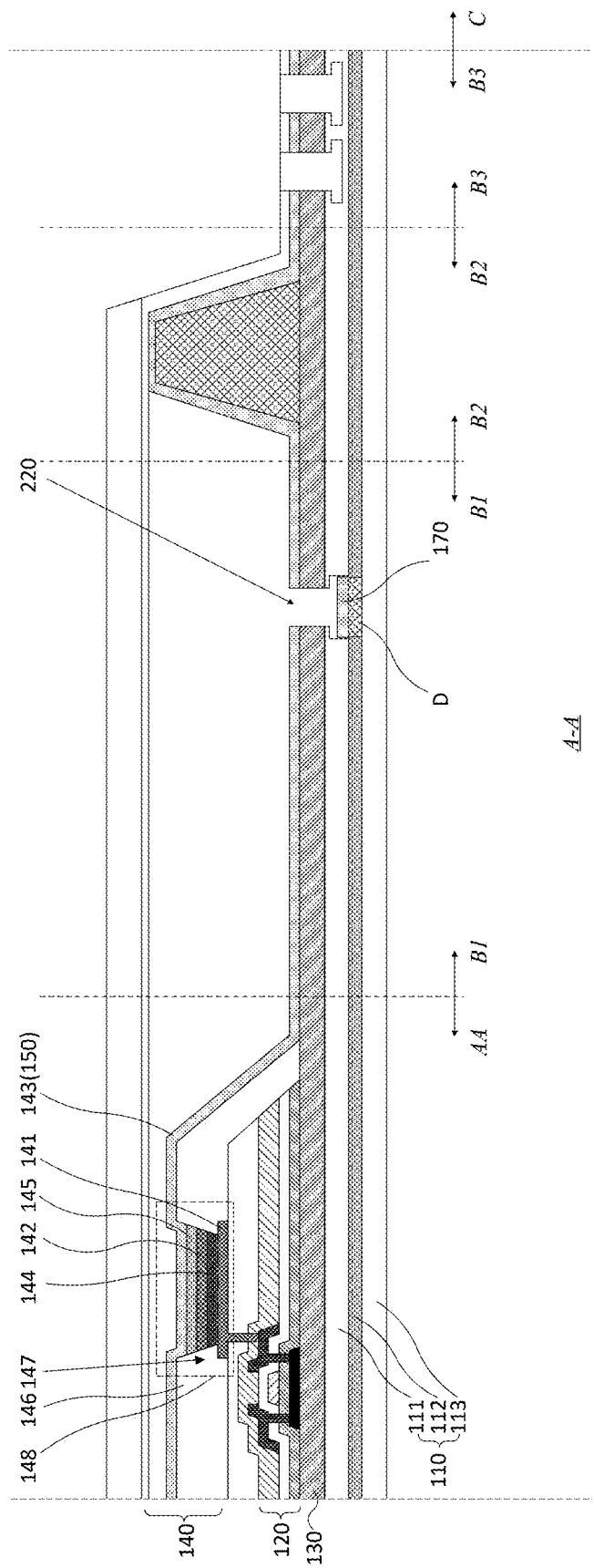
FIG. 14 is another sectional view of section A-A of a display panel according to an embodiment of the present application in FIG. 1.

Further, with reference to FIG. 14, along the thickness direction of the display panel 10, the second anti-static groove 220 partitions the first flexible layer 111, and the third conductive layer 170 is formed on an upper surface of the doped region D.

The second anti-static groove 220 partitions the first flexible layer 111 so that the doped region D of the inorganic layer 112 is exposed at the bottom of the second anti-static groove 220, that is, the doped region D is located directly below the second anti-static groove 220. The third conductive layer 170 covers the upper surface of the doped region D to improve a static electricity absorption capability of the doped region D, which improves the anti-static capability of the display panel 10 according to the embodiments of the present application.

Further, the material of the inorganic layer 112 contains an element of silicon and the doped region D is doped with an element of boron to form the hole structure.

In the embodiments of the present application, the inorganic layer 112 is made of a material of amorphous silicon and contains an element of silicon. In the doped region D, the inorganic layer 112 is doped with an element of boron, and under a condition that a 3-valent boron atom and four surrounding 4-valent silicon atoms form a covalent structure, one electron is absent, and thus a hole is formed, so that a P-type amorphous semiconductor structure with the hole structure is formed in the doped region D. Under a condition that the static electricity is conducted to the doped region D, electrons required for static electricity conduction enter the hole structure, so that the further conduction of the static electricity is blocked to achieve static electricity adsorption effects. Under a condition that boron is doped, the inorganic layer 112 is prepared first, the first flexible layer 111 and the buffer layer 130 are prepared on the inorganic layer 112, and the second anti-static groove 220 is made by using the method of under-cut, under this condition, the inorganic layer 112 is exposed at the bottom of the second anti-static groove 220, and under this condition, the inorganic layer 112 is doped with the element of boron to form the doped region D. In an example, the inorganic layer 112 may be doped with the element of boron by using a method of chemical vapor deposition.

Figure 15:
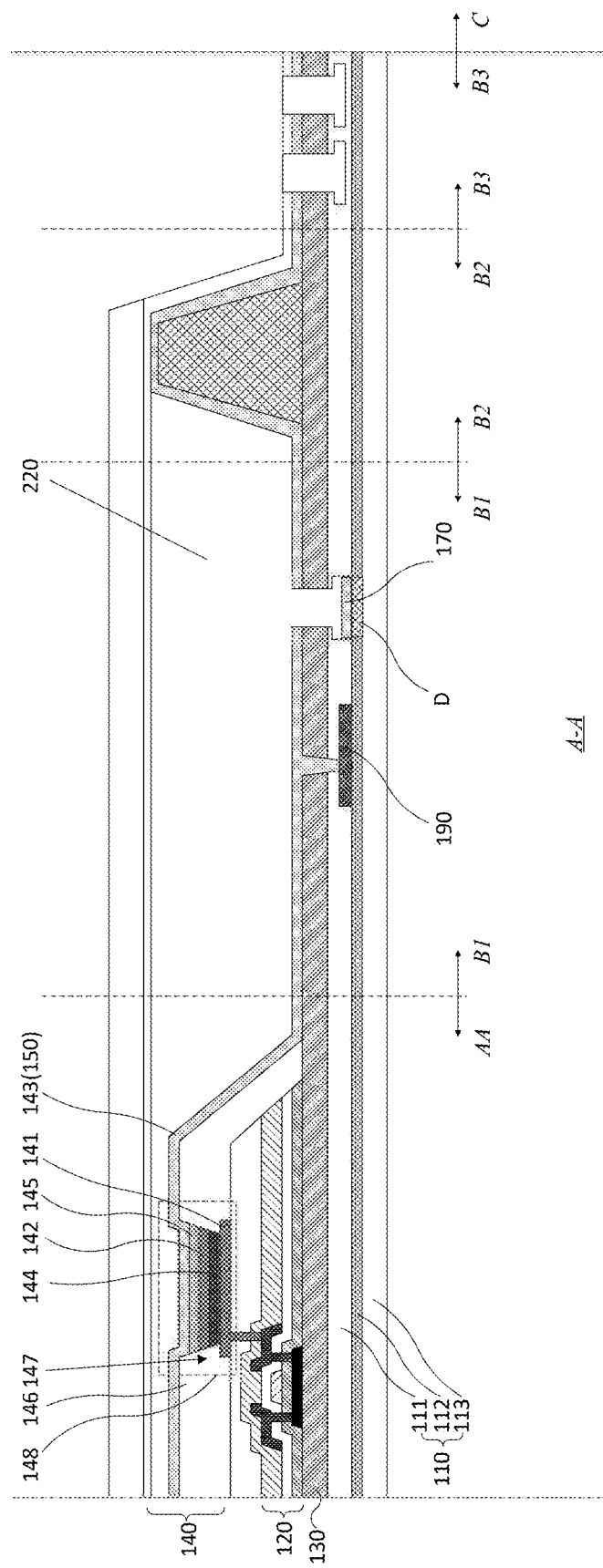
FIG. 15 is another sectional view of section A-A of a display panel according to an embodiment of the present application in FIG. 1.

FIG. 15 is another sectional view of section A-A of a display panel according to an embodiment of the present application in FIG. 1.

Further, with reference to FIG. 15, the display panel 10 according to the embodiments of the present application further includes a fifth conductive layer 190, along the direction from the first conductive layer to the substrate, the fifth conductive layer 190 is located between the inorganic layer 112 and the first flexible layer 111, and along a direction from the doped region D to the display region AA, the fifth conductive layer 190 is located between the doped region D and the display region AA, and the fifth conductive layer 190 is electrically connected to the first conductive layer 150.

The fifth conductive layer 190 is located between the doped region D and the display region AA, and the fifth conductive layer 190 is in contact with the inorganic layer 112, and the fifth conductive layer 190 is electrically connected to the first conductive layer 150. Since the inorganic layer 112 also has certain conductivity, the inorganic layer 112, the fifth conductive layer 190 and the first conductive layer 150 can form a conduction path for the static electricity. Under a condition that an amount of the static electricity is relatively great, the semiconductor structure formed in the doped region D will be saturated, and the static electricity will be conducted continuously to the display region from the second anti-static groove 220 via the inorganic layer 112. Since conductivity of the fifth conductive layer 190 and the first conductive layer 150 is significantly superior to conductivity of the inorganic layer 112 and the first flexible layer 111, excessive static electricity may be conducted to the first conductive layer 150 via the fifth conductive layer 190, thereby blocking the conduction of the static electricity to the display region AA along the inorganic layer 112, which further improves the anti-static capability of the display panel 10 according to the embodiments of the present application. Under a condition that the first conductive layer 150 is reused as the cathode 143 of the light-emitting functional layer 140, the low-level signal of the first conductive layer 150 covers the voltage of the static electricity to reduce the effects of the static electricity on the display region AA.

Figure 16:
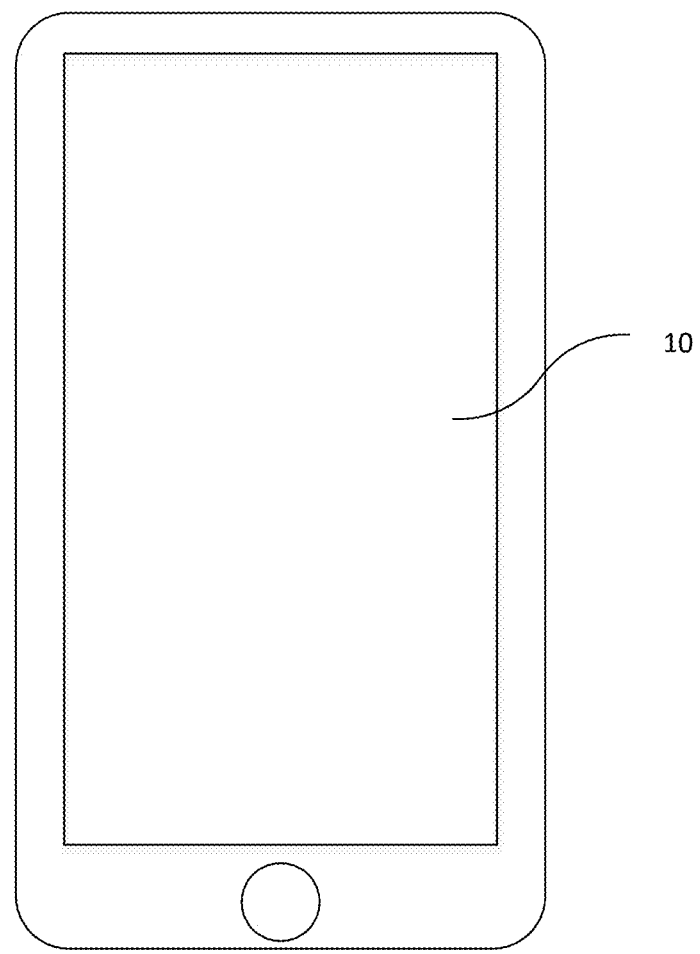
FIG. 16 is a schematic view of a display apparatus according to an embodiment of the present application.

FIG. 16 is another sectional view of section A-A of a display panel according to an embodiment of the present application in FIG. 1.

With reference to FIG. 16, the embodiments of the present application further provide a display apparatus. The display apparatus includes the display panel 10 according to any one of the embodiments described above. The display apparatus according to the embodiments of the present application may be any product or component with display function, such as a mobile phone, a tablet computer, a television, a display, a notebook computer, a digital photo frame, a navigator, and the like.

In summary, in the display panel and the display apparatus according to the embodiments of the present application, the first partition region is arranged between the display region and the aperture region, and the first anti-static groove or the second anti-static groove is arranged in the first partition region to reduce the possibility that the static electricity affects the normal light emission of the display panel. The second conductive layer of the first anti-static groove is electrically connected to the first conductive layer and is in contact with the first flexible layer, which can guide the static electricity to the first conductive layer and reduce the effects of the static electricity on the light-emitting device; and the second anti-static groove partitions the first flexible layer, which blocks the conduction of the static electricity to the display region. Therefore, the display panel and the display apparatus according to the embodiments of the present application can reduce the effects of the static electricity on the light-emitting device in the display region, which improves the anti-static capability of the display panel according to the embodiments of the present application.

The above are only specific implementations of the present application, but the protection scope of the present application is not limited to thereto. Any person skilled in the art can easily think of changes or substitutions within the technical scope disclosed in the present application, and these changes or substitutions should be covered within the protection scope of the present application. Therefore, the protection scope of the present application should be subject to the protection scope of the claims.

What is claimed is:

1. A display panel comprising a display region, an aperture region and a first partition region, wherein the first partition region surrounds the aperture region, and the display region surrounds the first partition region;
along a thickness direction of the display panel, the display panel comprises:
a substrate comprising a first flexible layer;
a buffer layer located at a side of the first flexible layer;
a first conductive layer located at a side of the buffer layer away from the first flexible layer; and
a first anti-static groove located in the first partition region and a second conductive layer located at the bottom of the first anti-static groove, wherein the first anti-static groove at least partitions the buffer layer, and the first conductive layer is electrically connected to the second conductive layer;
the first conductive layer is reused as the second conductive layer, and the first conductive layer is a cathodic evaporation layer and is continuously distributed on a sidewall of the first anti-static groove.

2. The display panel according to claim 1, wherein the first anti-static groove partitions the first conductive layer and the buffer layer, and the second conductive layer is formed on a surface of the first flexible layer.

3. The display panel according to claim 1, wherein an opening width of the first anti-static groove decreases along the direction from the first conductive layer to the substrate; and a bottom width of the first anti-static groove is greater than zero such that the first conductive layer covers, at the bottom of the first anti-static groove, at least a part of the first flexible layer.

4. A display panel, comprising a display region, an aperture region and a first partition region, wherein the first partition region surrounds the aperture region, and the display region surrounds the first partition region;
along a thickness direction of the display panel, the display panel comprises:
a substrate comprising a first flexible layer;
a buffer layer located at a side of the first flexible layer;
a first conductive layer located at a side of the buffer layer away from the first flexible layer; and
a first anti-static groove located in the first partition region and a second conductive layer located at the bottom of the first anti-static groove, wherein the first anti-static groove at least partitions the buffer layer, and the first conductive layer is electrically connected to the second conductive layer;
the display panel further comprising a first partition groove arranged around the aperture region, wherein along a direction from the aperture region to the display region, the first partition groove is located between the first anti-static groove and the aperture region, and the first partition groove partitions the first conductive layer, the buffer layer and at least a part of the first flexible layer.

5. A display panel, comprising a display region, an aperture region and a first partition region, wherein the first partition region surrounds the aperture region, and the display region surrounds the first partition region;
along a thickness direction of the display panel, the display panel comprises:
a substrate comprising a first flexible layer;
a buffer layer located at a side of the first flexible layer;
a first conductive layer located at a side of the buffer layer away from the first flexible layer; and
a second anti-static groove located in the first partition region and a third conductive layer located at the bottom of the second anti-static groove, wherein the second anti-static groove at least partially surrounds the aperture region, the second anti-static groove partitions at least a part of the first flexible layer along a direction from the first conductive layer to the substrate, and the third conductive layer and the first conductive layer are arranged to be insulated;
wherein the substrate further comprises:
an inorganic layer, located at a side of the first flexible layer away from the buffer layer;
a second flexible layer, located at a side of the inorganic layer away from the first flexible layer;
the second anti-static groove partitions the first flexible layer and at least a part of the inorganic layer along the direction from the first conductive layer to the substrate.

6. The display panel according to claim 5, wherein along a direction from the aperture region to the display region, an opening width of the second anti-static groove is a first width, and along the direction from the first conductive layer to the substrate, a first width of an end of the second anti-static groove close to the first conductive layer is less than a first width of the bottom of the second anti-static groove.

7. The display panel according to claim 5, further comprising a fourth conductive layer, wherein along the direction from the first conductive layer to the substrate, the fourth conductive layer is located between the inorganic layer and the buffer layer, and along the direction from the aperture region to the display region, the fourth conductive layer is located between the second anti-static groove and the display region, and the fourth conductive layer is electrically connected to the first conductive layer.

8. The display panel according to claim 5, wherein the inorganic layer comprises a doped region located in the first partition region, and the doped region has a hole structure.

9. The display panel according to claim 8, wherein along the thickness direction of the display panel, an orthographic projection of the second anti-static groove on the display panel at least partially overlaps an orthographic projection of the doped region on the display panel.

10. The display panel according to claim 8, wherein along the thickness direction of the display panel, the second anti-static groove partitions the first flexible layer, and the third conductive layer is formed on an upper surface of the doped region.

11. The display panel according to claim 8, wherein a material of the inorganic layer contains an element of silicon and the doped region is doped with an element of boron to form the hole structure.

12. The display panel according to claim 8, further comprising a fifth conductive layer, wherein along the direction from the first conductive layer to the substrate, the fifth conductive layer is located between the inorganic layer and the first flexible layer, and along a direction from the doped region to the display region, the fifth conductive layer is arranged between the doped region and the display region, and the fifth conductive layer is electrically connected to the first conductive layer.

13. A display apparatus comprising the display panel according to claim 1.

\* \* \* \* \*